(12) United States Patent
Lee

(10) Patent No.: US 11,736,785 B2
(45) Date of Patent: Aug. 22, 2023

(54) CAMERA MODULE

(71) Applicant: TRIPLE WIN TECHNOLOGY (SHENZHEN) CO. LTD., Shenzhen (CN)

(72) Inventor: Ming-Hsun Lee, New Taipei (TW)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 130 days.

(21) Appl. No.: 17/213,836

(22) Filed: Mar. 26, 2021

(65) Prior Publication Data
US 2022/0232147 A1 Jul. 21, 2022

(30) Foreign Application Priority Data

Jan. 18, 2021 (CN) .......................... 202110064272.8

(51) Int. Cl.
| | |
|---|---|
| G03B 17/00 | (2021.01) |
| H04N 23/50 | (2023.01) |
| G03B 17/02 | (2021.01) |
| H05K 3/32 | (2006.01) |
| H05K 1/11 | (2006.01) |

(52) U.S. Cl.
CPC ............ *H04N 23/50* (2023.01); *G03B 17/02* (2013.01); *H05K 1/118* (2013.01); *H05K 3/321* (2013.01); *H05K 2201/0338* (2013.01)

(58) Field of Classification Search
CPC .... H04N 5/2251; H04N 5/2257; G03B 17/02; H05K 1/118; H05K 3/321; H05K 2201/0338
See application file for complete search history.

(56) References Cited

U.S. PATENT DOCUMENTS

| | | | |
|---|---|---|---|
| 9,640,475 B1* | 5/2017 | Lin | H01L 23/50 |
| 2007/0177279 A1* | 8/2007 | Cho | G02B 7/102 |
| | | | 359/692 |
| 2011/0194023 A1* | 8/2011 | Tam | H01L 27/14618 |
| | | | 348/374 |
| 2018/0164539 A1* | 6/2018 | Hsu | G03B 17/02 |
| 2018/0352127 A1* | 12/2018 | Wang | H04N 5/2254 |
| 2019/0020798 A1* | 1/2019 | Wang | G03B 17/561 |
| 2021/0014391 A1* | 1/2021 | Uemura | H05K 1/189 |
| 2021/0185804 A1* | 6/2021 | Huang | H05K 1/0274 |

FOREIGN PATENT DOCUMENTS

| | | |
|---|---|---|
| CN | 108363159 A | 8/2018 |
| CN | 104917944 B | 5/2019 |
| CN | 105721749 B | 7/2020 |
| CN | 211554592 U | 9/2020 |

* cited by examiner

*Primary Examiner* — Jason A Flohre
(74) *Attorney, Agent, or Firm* — ScienBiziP, P.C.

(57) ABSTRACT

A camera module includes a circuit board, a bracket arranged on the circuit board, and at least one electronic component embedded in the bracket and/or arranged on an inner side wall of the bracket. The electronic component is electrically coupled to the circuit board.

12 Claims, 12 Drawing Sheets

CAMERA MODULE

FIELD

The subject matter herein generally relates to camera modules, and more particularly to an arrangement configuration of electronic components in a camera module.

BACKGROUND

A camera module design generally has a photosensitive chip placed in a center of a PCB, and electronic components are arranged around the photosensitive chip. As the number of electronic components increases, but manufactures of camera modules may not be able to reduce the size of the camera module.

BRIEF DESCRIPTION OF THE DRAWINGS

Implementations of the present disclosure will now be described, by way of embodiments, with reference to the attached figures.

DETAILED DESCRIPTION

Figure 1:
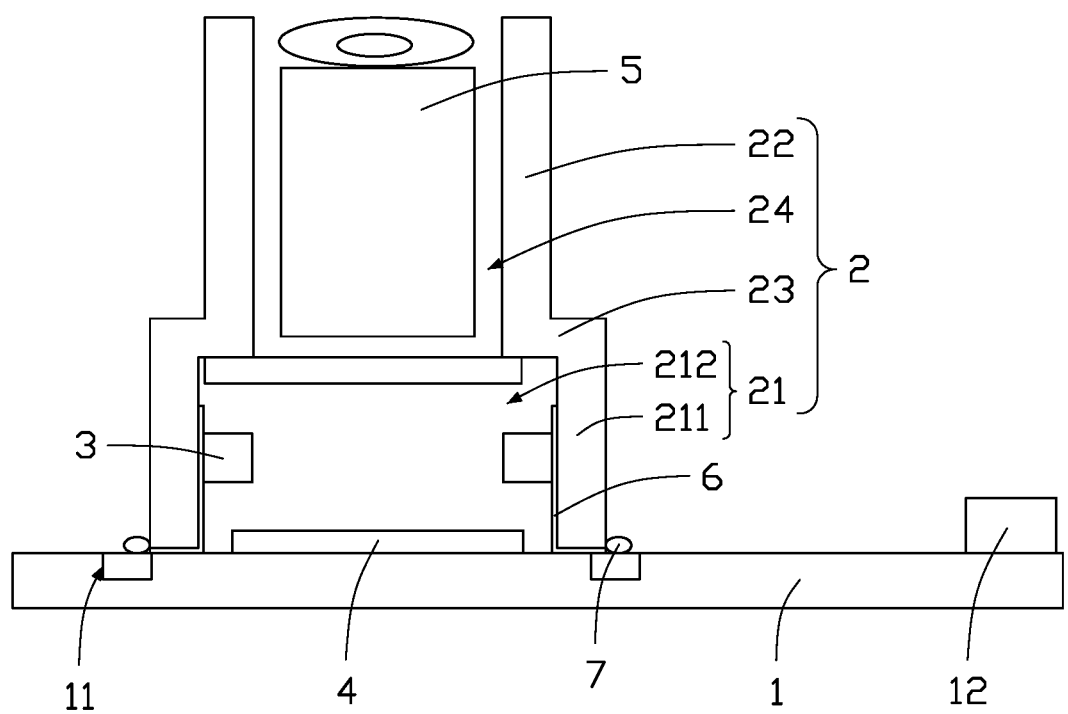
FIG. 1 is a schematic structural diagram of a first camera module provided by an embodiment of the present application.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

In general, the word "module" as used hereinafter refers to logic embodied in hardware or firmware, or to a collection of software instructions, written in a programming language such as, for example, Java, C, or assembly. One or more software instructions in the modules may be embedded in firmware such as in an erasable-programmable read-only memory (EPROM). It will be appreciated that the modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

FIGS. 1-5 show a first embodiment of a camera module 100. The camera module 100 includes a circuit board 1, a bracket 2, and an electronic component 3. The bracket 2 is arranged on the circuit board 1. The electronic component 3 is arranged on an inner side wall of the bracket 2. The electronic component 3 is electrically coupled to the circuit board 1.

The camera module 100 further includes a photosensitive chip 4 and a lens 5. The photosensitive chip 4 is arranged on the circuit board 1 and accommodated in the bracket 2. The lens 5 is arranged on the bracket 2. The lens 5 is located on a light-sensing path of the photosensitive chip 4.

As shown in FIG. 1, the bracket 2 is substantially a hollow cylindrical structure, which includes a base portion 21 and a lens barrel portion 22 coupled to the base portion 21. Each of the base portion 21 and the lens barrel portion 22 is a hollow structure, and a cross-sectional size of the base portion 21 is larger than a cross-sectional size of the lens barrel portion 22. The base portion 21 includes a first side wall 211, and the lens barrel portion 22 includes a second side wall 221. The first side wall 211 encloses a first cavity 212, and the second side wall 221 encloses a second cavity 222. A step 23 is formed between the first side wall 211 and the second side wall 221. The photosensitive chip 4 is received in the first cavity 212, and the lens 5 is received in the second cavity 222. The electronic component 3 is arranged on an inner surface of the first side wall 211. Specifically, the electronic component 3 is disposed on the inner surface of the first side wall 211.

Referring to FIGS. 1-4, two specific implementations for electrically coupling the electronic component 3 and the circuit board 1 are provided.

As shown in FIG. 1, in one embodiment, a first conductive layer 6 is arranged on the surface of the first side wall 211, and the first conductive layer 6 is electrically coupled to the circuit board 1, thereby electrically coupled to the electronic component 3. The circuit board 1 is provided with a corresponding first window 11 on an outer side of the bracket 2, and a corresponding copper layer is exposed through the first window 11. The first conductive layer 6 is electrically coupled to the exposed copper layer at the first opening 11, and then electrically coupled to the electronic component 3 through a corresponding circuit layer of the circuit board 1 to control the electronic component 3.

In this embodiment, after the first conductive layer 6 is led out of the bracket 2, the first conductive layer 6 is electrically coupled to the exposed copper layer at the first window 11 by a soldering means. Since tin soldering may burn the bracket 2, a dot of conductive glue 7 may be used to couple the first conductive layer 6 to the exposed copper layer at the first window 11. A controller 12 is used to control the electronic component 3. Compared with the soldering method, the conductive glue 7 is directly used for connection, which is simpler and more convenient to operate, and the conductive glue 7 does not have the hidden danger of burning the bracket 2.

In this embodiment, the first conductive layer 6 may be a conductive adhesive layer or a conductive metal plating layer. Specifically, the first conductive layer 6 is a conductive adhesive layer. The conductive adhesive layer not only realizes electrical connection between the electronic component 3 and the circuit board 1, but also fixedly mounts the electronic component 3 on the first side wall 211. Thus, there is no need to add an additional fixing structure for mounting the electronic component 3 to the first side wall 211, which simplifies installation of the electronic component 3 and frees up space inside the bracket 2.

In this embodiment, when the first conductive layer 6 is a conductive adhesive layer, the conductive adhesive layer is formed by laser direct structuring (LDS) on the inner surface of the first side wall 211. Where the electronic component 3 is arranged, conductive glue is applied along the inner surface of the first side wall 211 to form the conductive adhesive layer, and then lead to the position of the first opening 11 of the circuit board 1 outside the bracket 2 to achieve electrical connection between the electronic component 3 and the exposed copper layer at the first opening 11.

It is understandable that the arrangement of the first conductive layer 6 can be designed according to the specific number of the electronic component 3. If the number of the electronic component 3 is only one, then the one electronic component 3 only needs to be led out of the bracket 2 through a piece of the first conductive layer 6 to achieve electrical connection with the circuit board 1. In order to realize multi-functionalization of the camera module 100, a plurality of the electronic components 3 are arranged in the camera module 100. The plurality of electronic components 3 are staggered and distributed on the inner surface of the first side wall 211. The first conductive layer 6 corresponding to the plurality of electronic components 3 is led out of the bracket 2 to the circuit board 1 through a circuit layout design to realize electrical connection. If the first conductive layer 6 is in the form of a conductive adhesive layer, the conductive adhesive layer can be precisely set on the surface of the bracket 2 by laser direct structuring (LDS). Two adjacent conductive adhesive layers can be controlled at the same time and do not overlap each other, so that electrical properties of different electronic components 3 are respectively guided to the outside of the bracket 2 and coupled to the corresponding circuit layers of the circuit board 1 through the first opening 11 on the circuit board 1, and the controller 12 controls the different electronic components 3 in a unified manner.

Figure 2:
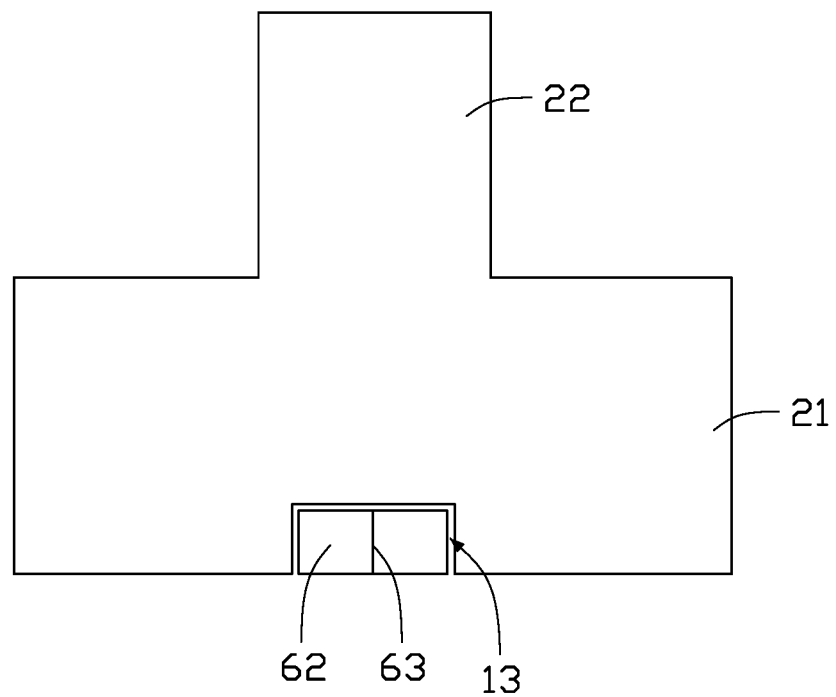
FIG. 2 is a schematic structural diagram of an embodiment of the first camera module camera module having a first flexible printed circuit (FPC) board.
Figure 4:
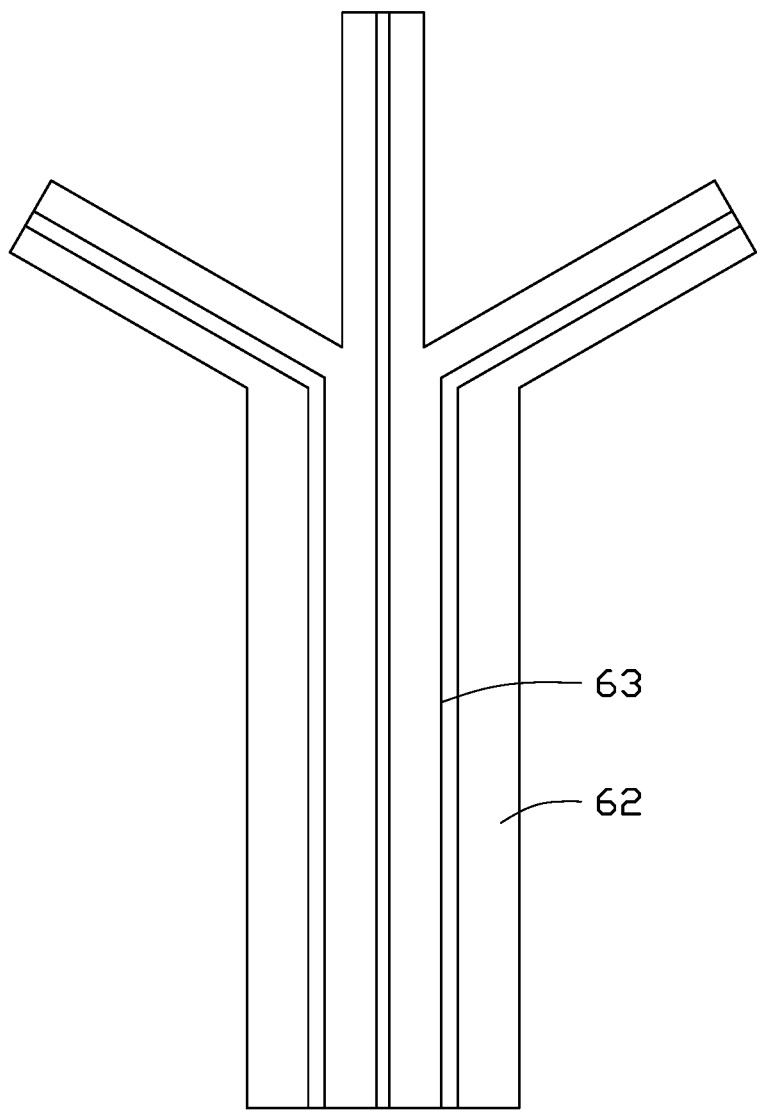
FIG. 4 is a schematic structural diagram of the first FPC board.

Referring to FIG. 2 and FIG. 4, and further to FIG. 1 in combination, in another embodiment, the electronic component 3 is electrically led out in the form of a first flexible printed circuit (FPC) board 8, and the electronic component 3 is electrically coupled to the circuit board 1 through the first FPC board 8. The first FPC board 8 includes a circuit 81 for realizing electrical connection. One end of the circuit 81 is coupled to the electronic component 3, and another end of the circuit 81 is coupled to the circuit board 1 to realize electrical connection between the electronic component 3 and the circuit layer of the circuit board 1. The circuit 81 may be set on the first FPC board 8 in advance, and then the first FPC board 8 is adhered to the inner surface of the first side wall 211. A wire outlet 13 is defined adjacent to a bottom of the first side wall 211, and the first FPC board 8 is bent and led out to outside of the bracket 2 and led to the circuit board 1. The corresponding first window 11 is defined in the circuit board 1 on the outer side of the bracket 2, and the circuit 81 of the first FPC board 8 is led out to the first window 11. In this embodiment, the two ends of the circuit 81 are electrically coupled to the electronic component 3 and the exposed copper layer at the first window 11 through soldering or the conductive glue 7.

Figure 3:
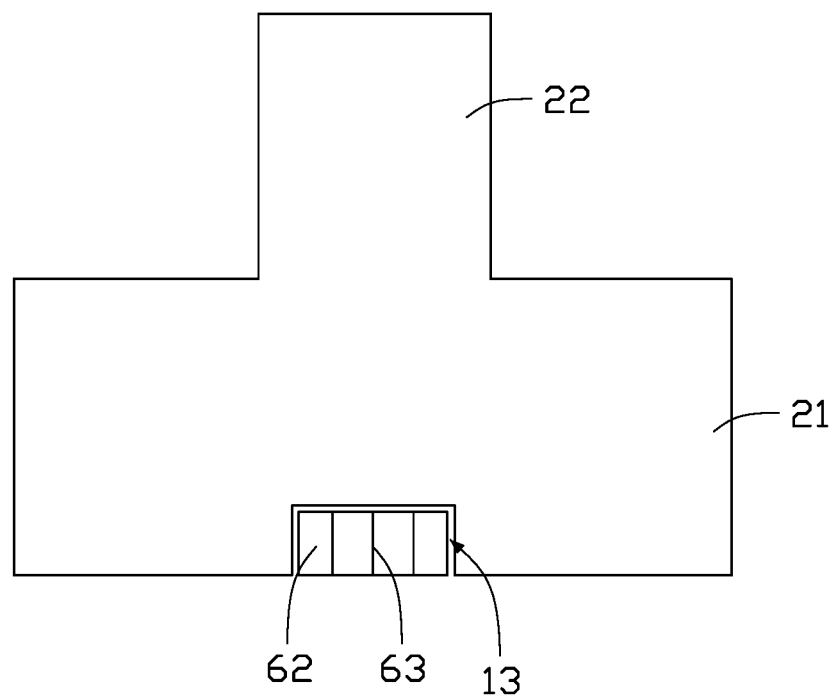
FIG. 3 is a schematic structural diagram of an embodiment of the first FPC board design.

The design of the first FPC board 8 corresponds to the number and arrangement of the electronic components 3 included in the camera module 100. When the camera module 100 contains only one electronic component 3, only one first FPC board 8 is provided, only one circuit 81 is provided on the first FPC board 8, and the first FPC board 8 is led through the outlet 13 to outside of the bracket 2 to the first window 11 on the circuit board 1, as shown in FIG. 2. When the camera module 100 contains more than one electronic component 3, more than one circuit 81 can be set on one first FPC board 8. A portion of the first FPC board 8 located on the inner side of the first side wall 211 is cut to diverge the circuits 81 to couple to the corresponding electronic components 3. A portion of the first FPC board 8 located on the outer side of the first side wall 211 is not cut and directly leads through the wire outlet 13, as shown in FIGS. 3 and 4. If the mounting positions of different electronic components 3 are relatively spaced apart and cannot be led out through the same first FPC board 8, each circuit 81 may be arranged on separate first FPC boards 8. In this way, the design of the first FPC board 8 is more flexible, and it is not necessary to set the entire inner side of the first side wall 211 as the first FPC board 8.

The first FPC board 8 is used to electrically couple the electronic component 3 to the circuit board 1. During assembly, the electronic component 3 can be fixed on the first FPC board 8, and then the first FPC board 8 is fixed to the inner surface of the first side wall 211. Thus, assembly is convenient, and manufacturing costs are reduced.

Figure 5:
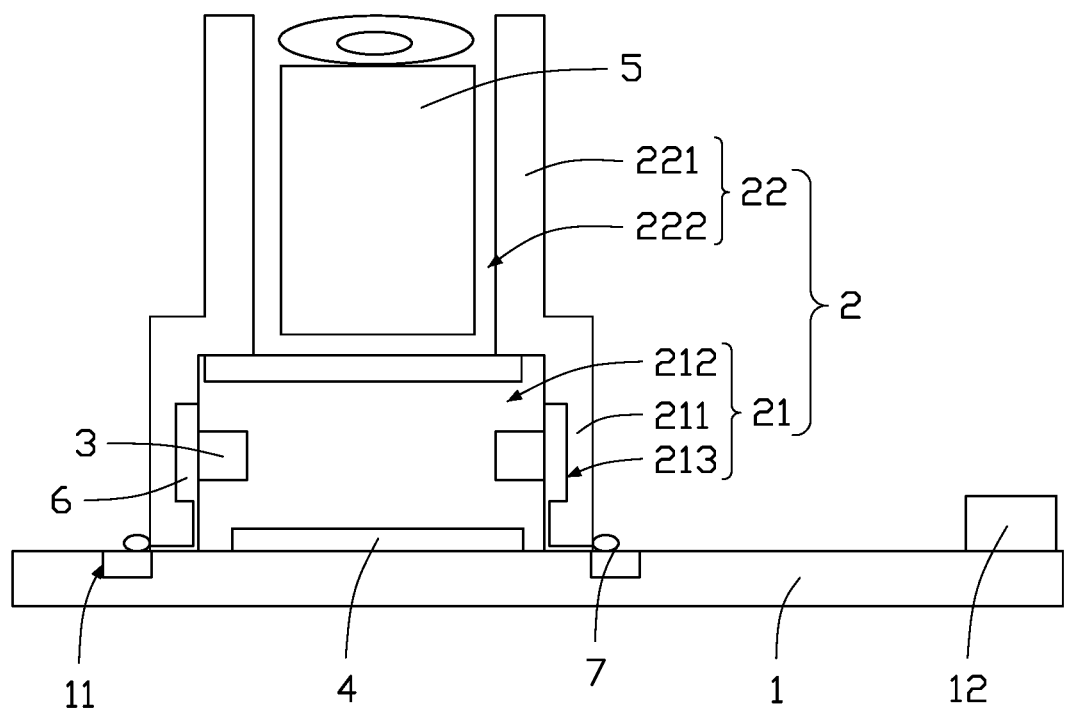
FIG. 5 is a schematic structural diagram of a first side wall of the first camera module camera module provided with a groove.

It is understandable that by adopting the above two different methods in the first embodiment for fixing the electronic component 3 on the inner surface of the first side wall 211, the electronic component 3 will not interfere with the photosensitive chip 4 sensing light entering the first cavity 212 through the lens 5. In addition, in order to further prevent the electronic component 3 from interfering with the photosensitive chip 4, a portion of the inner surface of the first side wall 211 may be recessed to define a groove 213, as shown in FIG. 5. A portion or all of the electronic component 3 is fixed in the groove 213, so that the electronic component 3 will not interfere with the photosensitive chip 4 from sensing light, thereby preventing issues such as light spots.

FIGS. 6-12 show a second embodiment of a camera module 200. In the second embodiment, the electronic component 3 is embedded in a first side wall 214 of the bracket 2. It should be noted that, within the scope of the spirit or basic features of the present disclosure, the specific solutions applicable to the first embodiment can also be correspondingly applied to the second embodiment, and will not be repeated here.

It is understandable that the specific position where the electronic component 3 is embedded in the first side wall 214 can be changed, and an electrical lead-out method of the electronic component 3 may be changed correspondingly.

In one embodiment, the electronic component 3 is located at an edge of the first side wall 214 facing the circuit board 1. A mounting hole 215 is defined in the side of the first side wall 214 facing the circuit board 1, and the electronic component 3 is embedded in the mounting hole 215. The circuit board 1 defines a second opening 14 corresponding to the mounting hole 215, and a circuit layer of the circuit board 1 is exposed in the second opening 14. The electronic component 3 is electrically coupled to the circuit layer at the second opening 14 through a second conductive layer 10. In this way, the electronic component 3 is directly fixed on the circuit board 1, so the electronic component 3 does not occupy an internal space of the bracket 2, which improves a space utilization of the camera module 200 and is beneficial for miniaturization of the camera module 200.

FIGS. 7-12 show different ways for mounting the electronic component 3 in the mounting hole 215.

Figure 7:
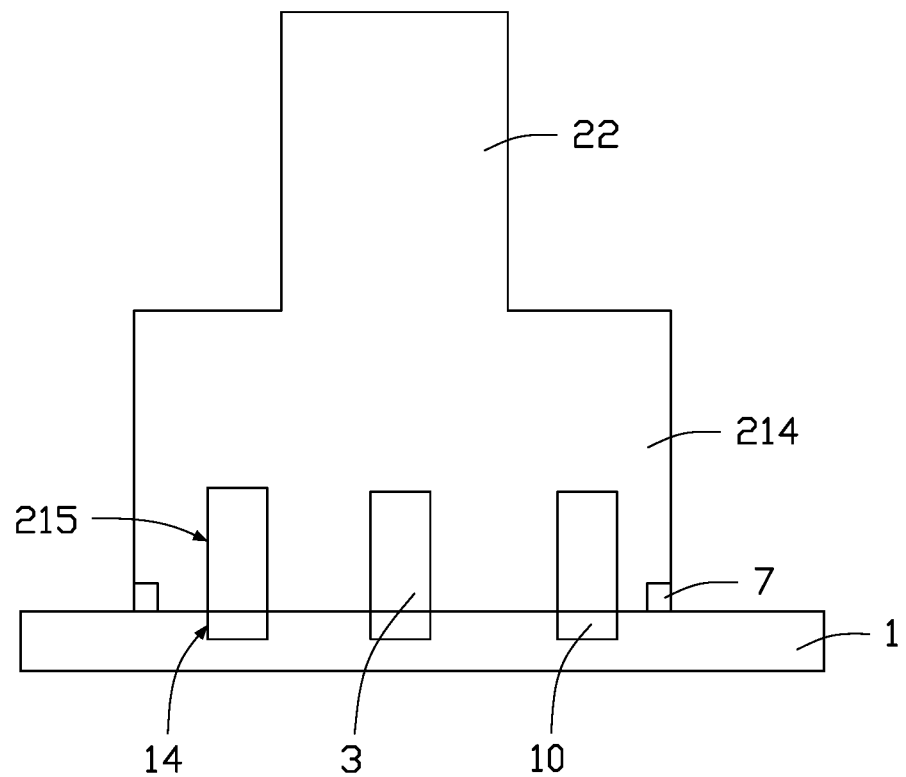
FIG. 7 is a schematic structural diagram of electronic components in the second camera module.

Referring to FIG. 7, in one embodiment, the electronic component 3 can be directly arranged in the mounting hole 215, and the electronic component 3 is electrically coupled to the circuit layer at the second opening 14 through the second conductive layer 10.

In order to improve stability of the electronic component 3, a thermosetting glue can be added between the electronic component 3 and a side wall of the mounting hole 215 for bonding and fixing. The thermosetting glue can fill a gap between the electronic component 3 and the mounting hole 215 to prevent light leakage.

The second conductive layer 10 may be conductive glue or solder paste. It is convenient and quick to bond the electronic component 3 with conductive glue. When the electronic component 3 is fixed by solder paste, a bonding force between the electronic component 3 and the circuit board 1 is stronger, which can improve the stability of the electronic component 3, which is beneficial to improving the overall stability of the camera module 200.

Figure 6:
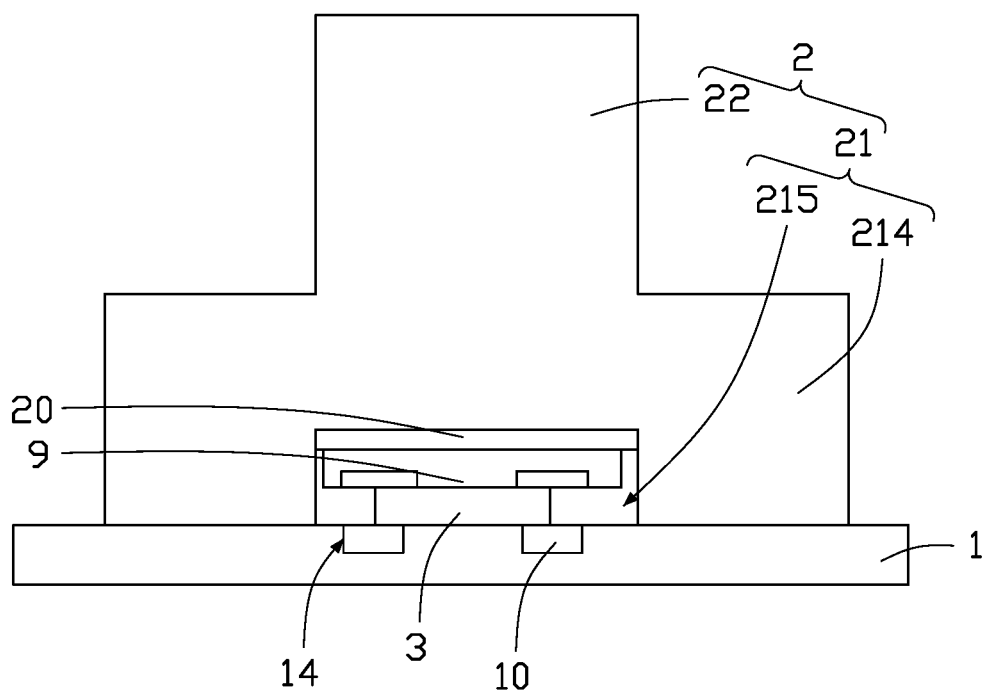
FIG. 6 is a schematic structural diagram of an embodiment of a second camera module.

Referring to FIG. 6, in another embodiment, the electronic component 3 is mounted in the mounting hole 215 through a second FPC board 9. The electronic component 3 faces a side of the circuit board 1. The electronic component 3 is electrically coupled to the circuit board 1 through the second conductive layer 10. The second FPC board 9 can facilitate alignment and bonding of the electronic component 3 in the mounting hole 215 and improve a surface flatness of the first side wall 214 after the electronic component 3 is bonded.

The second FPC board 9 may be fixed in the mounting hole 215 through a thermosetting adhesive layer 20.

The second conductive layer 10 may adopt the same design as the first conductive layer 6 in the first embodiment and will not be repeated here.

After the electronic component 3 is mounted in the mounting hole 215, if there is a gap, a thermosetting adhesive can be used to fill in the gap to prevent light leakage of the camera module 200.

In one embodiment, the electronic component 3 may be mounted on a metal sheet (not shown), and the metal sheet can improve flatness of the surface of the first side wall 214.

A size of the mounting hole 215 can be designed according to the actual number and size of the electronic components 3.

As shown in FIG. 6, the electronic component 3 is arranged such that two ends of the electronic component 3 are arranged horizontally in the mounting hole 215.

The two ends of the electronic component 3 are a power supply terminal and a ground terminal, respectively. Power connection and grounding of the electronic component 3 are realized through two second conductive layers 10 and two second openings 14, respectively.

As shown in FIG. 7, the electronic component 3 is arranged such that the power supply terminal and the ground terminal of the electronic component 3 are arranged vertically in the mounting hole 215. The power supply terminal of each electronic component 3 is electrically coupled to the circuit layer of the circuit board 1 at the second opening 14 through the second conductive layer 10, thereby achieving electrical connection with the controller 12 on the circuit board 1. The ground terminal of the electronic component 3 is grounded through the bracket 2.

There are three specific ways for grounding the electronic component 3 through the bracket 2.

Figure 8:
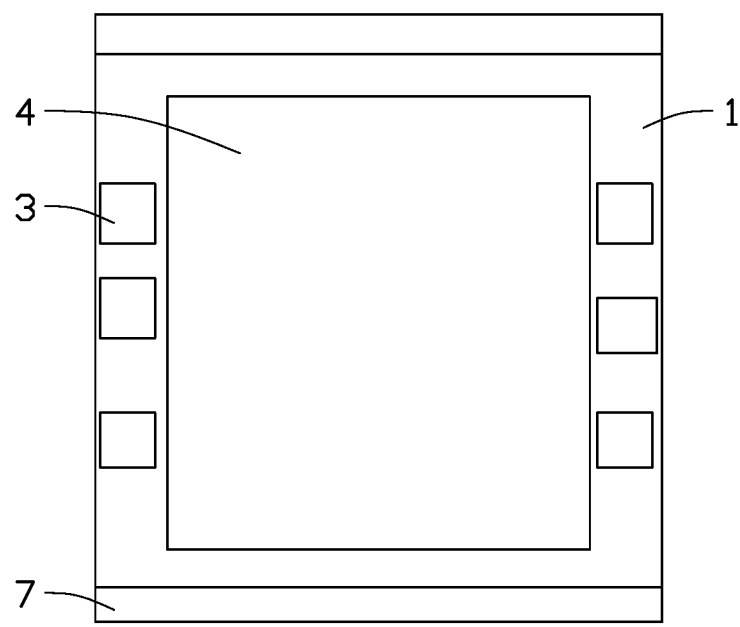
FIG. 8 is similar to FIG. 7, but shown from another angle.

Referring to FIG. 7 and FIG. 8, in a first way for grounding the electronic component 3 through the bracket 2, the first side wall 214 of the bracket 2 is provided with a plating layer, or the bracket 2 is made of metal, and the conductive glue 7 is applied between the electronic component 3 and the first side wall 214 and between the first side wall 214 and the circuit board 1, so that the electronic component 3 is indirectly electrically coupled and grounded to the circuit board 1 through the first side wall 214. The conductive glue 7 may be fully or partially applied between the first side wall 214 and the circuit board 1. When partially applied between the first side wall 214 and the circuit board 1, a thermosetting glue can be applied to remaining portions between the first side wall 214 and the circuit board 1, thereby reducing use of the conductive glue 7 and saving costs.

Figure 9:
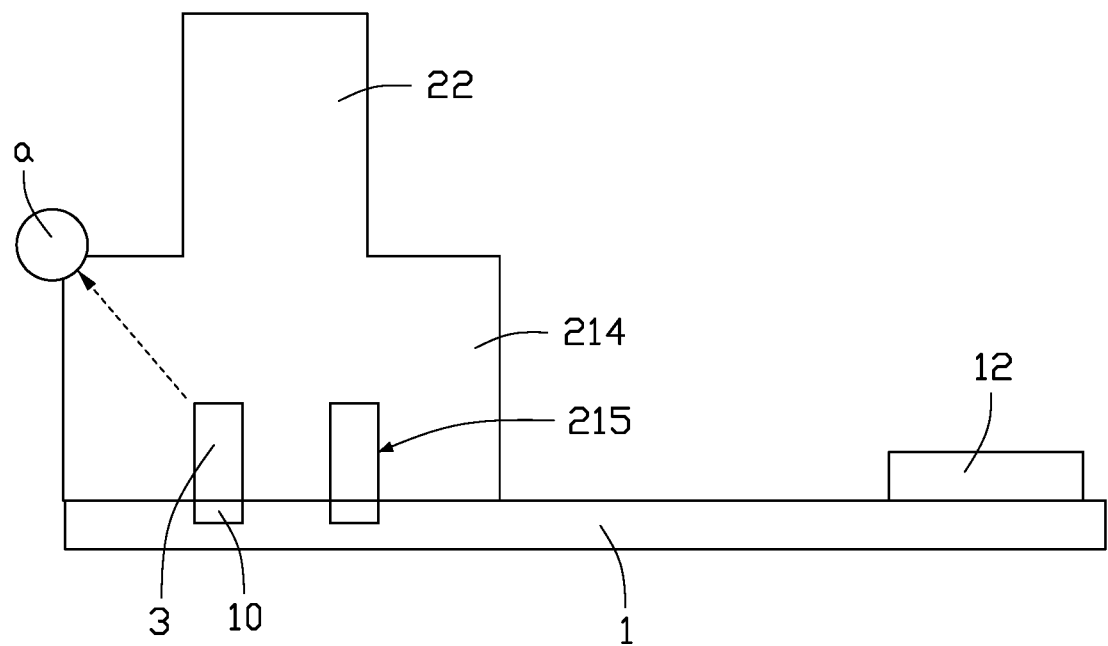
FIG. 9 is a schematic structural diagram of the electronic components in the second camera module grounded through a bracket.
Figure 10:
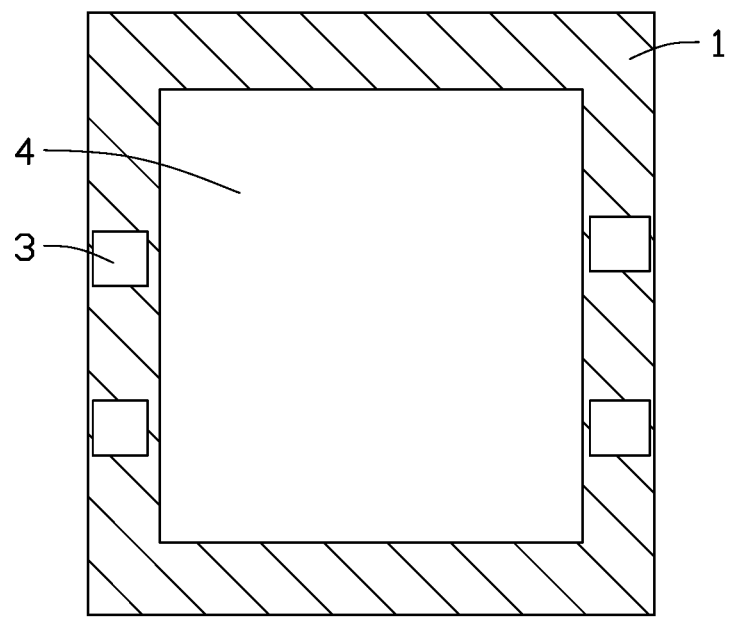
FIG. 10 shows the second camera module with no bracket.

Referring to FIG. 9 and FIG. 10, in a second way for grounding the electronic component 3 through the bracket 2, the first side wall 214 of the bracket 2 is provided with a plating layer, or the bracket 2 is made of metal, and the electronic component 3 is grounded through an electrical contact point a between the bracket 2 and an outer casing of the camera module 200 (not shown). The bracket 2 and the circuit board 1 can be fixed together by a thermosetting glue, so that conductive glue is not required, which saves costs.

Figure 11:
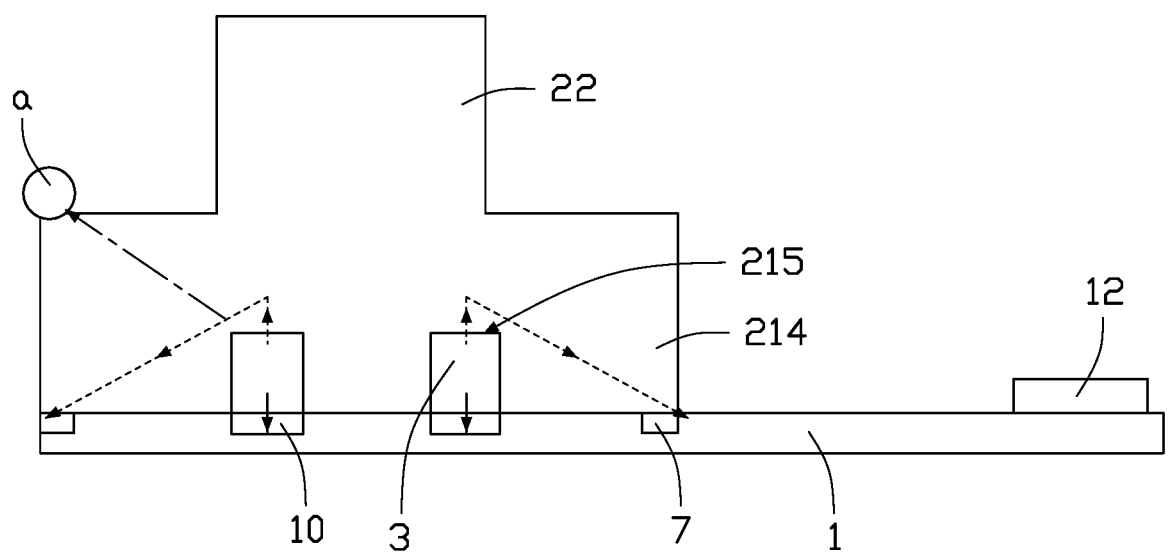
FIG. 11 is a schematic diagram of electrical conduction paths of electronic components in the second camera module.

As shown in FIG. 11, in a third way for grounding the electronic component 3 through the bracket 2, the first way and the second way are combined. Specifically, the electronic component 3 is electrically coupled to the circuit board 1 through the second conductive layer 10, and the electronic component 3 is electrically coupled and grounded to the circuit board 1 through the first sidewall 214 and the conductive glue 7. In addition, the electronic component 3 is grounded through the electrical contact point a between the first side wall 214 and the housing.

In summary of the second embodiment, the electronic component 3 is embedded in the bracket 2. Besides saving space and facilitating miniaturization of the camera module 200, the electronic component 3 mounted in the mounting hole 215 helps to improve the stability of the electronic component 3 due to the limiting effect of the side walls of the mounting hole 215. The electronic component 3 is directly mounted on the circuit board 1 and fixedly coupled to the first side wall 214, which improves a lateral stability of the bracket 2 and the camera module 200. In addition, the surface of the first side wall 214 is provided with a plating layer, which is beneficial for improving an electromagnetic shielding ability of the camera module 200. Furthermore, the electronic component 3 grounded to the housing through the first side wall 214 can pass high-frequency noise to the housing through the first side wall 214, thereby reducing an influence of the high-frequency noise on the photosensitive chip 4 or other components.

Figure 12:
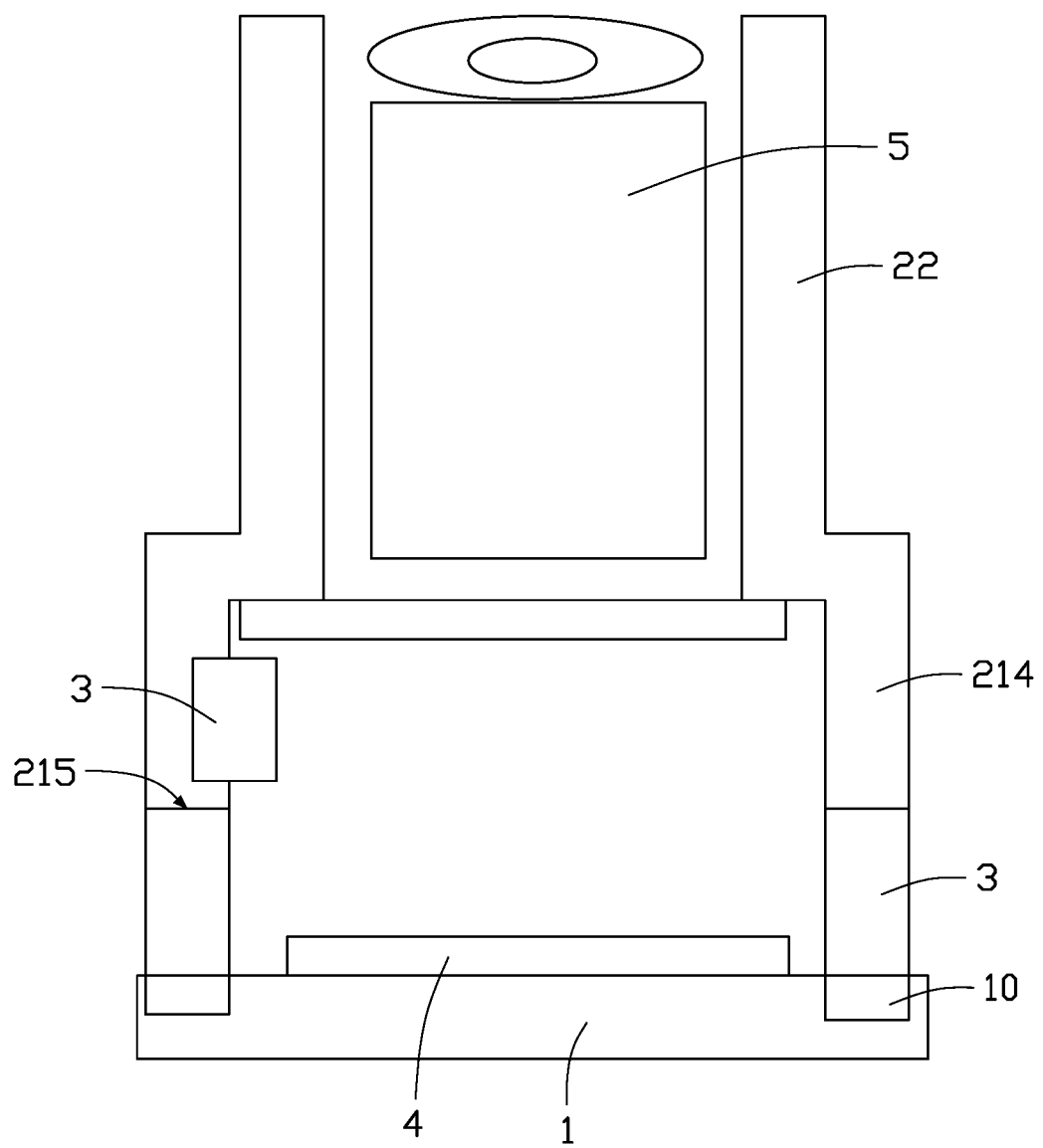
FIG. 12 is a schematic structural diagram of a third camera module.

FIG. 12 shows a third embodiment of a camera module 300. The third embodiment of the camera module 300 combines the solutions of the first embodiment and the second embodiment. In other words, one or more electronic components 3 is embedded in the first side wall 214 of the bracket 2, and one or more electronic components 3 is mounted on an inner side of the first side wall 214. The electronic components 3 may be capacitors, resistors, driver chips, memories, and the like. Depending on the number and size of the electronic components 3, the specific solutions applicable to the first embodiment and the second embodiment are also correspondingly applied to the third embodiment, and will not be repeated.

In summary, the space of the first side wall 214 of the bracket 2 can be fully utilized, the space utilization rate is improved, and the size of the camera module 300 is reduced. The electronic components 3 do not affect the sensitivity of the photosensitive chip 4 or cause stray light, and performance of the camera module is improved. The electronic component 3 attached or embedded in the first side wall 214 increases a surface area of heat dissipation, thereby improving a heat dissipation efficiency of the electronic component 3. Since the surface of the bracket 2 is provided with a plating layer, the electromagnetic shielding ability of the camera module is improved, and high-frequency noise reduction is achieved. Furthermore, a surface flatness of the bracket 2 is improved, and no SMT process is required, thereby reducing an assembly process of the camera module.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A camera module comprising:
 a circuit board;
 a bracket arranged on the circuit board; and
 at least one electronic component embedded in the bracket and/or arranged on an inner side wall of the bracket, wherein the electronic component is electrically coupled to the circuit board;
 the bracket defines a mounting hole in a side of the bracket facing the circuit board;
 the electronic component is arranged in the mounting hole;
 the circuit board is provided with a second window corresponding positioned relative to the mounting hole;
 the electronic component is electrically coupled to a circuit layer of the circuit board exposed in the second window through a second conductive layer;
 one end of the electronic component is electrically coupled to the circuit board through the second conductive layer;
 another end of the electronic component is grounded through the bracket; and
 the bracket is electrically conductive.

2. The camera module of claim 1, wherein:
 a first conductive layer or a first flexible printed circuit (FPC) board is arranged between the bracket and the electronic component; and
 the electronic component is electrically coupled to the circuit board through the first conductive layer or the first FPC board.

3. The camera module of claim 2, wherein:
 the bracket defines a wire outlet corresponding to the first FPC board;
 the circuit board defines a first window corresponding to the wire outlet;
 a circuit layer of the circuit board is exposed by the first window, and
 the first FPC board extends through the wire outlet to outside the bracket and is electrically coupled to a circuit layer of the circuit board exposed in the first window.

4. The camera module of claim 2, wherein the first conductive layer is a conductive adhesive layer.

5. The camera module of claim 1, wherein the electronic component is embedded in the bracket through a second FPC board or a metal sheet.

6. A camera module comprising:
 a circuit board defining at least one window;
 a bracket arranged on the circuit board; and
 at least one electronic component embedded in the bracket and/or arranged on an inner side wall of the bracket, wherein the electronic component is electrically coupled to a circuit layer of the circuit board exposed in the at least one window;
 the bracket defines a mounting hole in a side of the bracket facing the circuit board;
 the electronic component is arranged in the mounting hole;
 the circuit board is provided with a second window corresponding in position relative to the mounting hole;
 the electronic component is electrically coupled to a circuit layer of the circuit board exposed in the second window through a second conductive layer;
 one end of the electronic component is electrically coupled to the circuit board through the second conductive layer;
 another end of the electronic component is grounded through the bracket; and
 the bracket is electrically conductive.

7. The camera module of claim 6, wherein:
 a first conductive layer or a first flexible printed circuit (FPC) board is arranged between the bracket and the electronic component; and
 the electronic component is electrically coupled to the circuit board through the first conductive layer or the first FPC board.

8. The camera module of claim 7, wherein:
 the bracket defines a wire outlet corresponding to the first FPC board;

the circuit board defines a first window corresponding to the wire outlet;

a circuit layer of the circuit board is exposed by the first window, and the first FPC board extends through the wire outlet to outside the bracket and is electrically coupled to a circuit layer of the circuit board exposed in the first window.

9. The camera module of claim 7, wherein the first conductive layer is a conductive adhesive layer.

10. The camera module of claim 6, wherein the electronic component is embedded in the bracket through a second FPC board or a metal sheet.

11. A camera module comprising:

a circuit board;

a bracket arranged on the circuit board; and at least one electronic component embedded in the bracket and/or arranged on an inner side wall of the bracket, wherein the electronic component is electrically coupled to the circuit board;

the electronic component is arranged on the inner side wall of the bracket;

a first flexible printed circuit (FPC) board is arranged between the bracket and the electronic component;

the electronic component is electrically coupled to the circuit board through the first conductive layer or the first FPC board;

the bracket defines a wire outlet corresponding to the first FPC board;

the circuit board defines a first window corresponding to the wire outlet;

a circuit layer of the circuit board is exposed by the first window, and the first FPC board extends through the wire outlet to outside the bracket and is electrically coupled to a circuit layer of the circuit board exposed in the first window.

12. A camera module comprising:

a circuit board defining at least one window;

a bracket arranged on the circuit board; and at least one electronic component embedded in the bracket and/or arranged on an inner side wall of the bracket, wherein the electronic component is electrically coupled to a circuit layer of the circuit board exposed in the at least one window;

the electronic component is arranged on the inner side wall of the bracket;

a first conductive layer or a first flexible printed circuit (FPC) board is arranged between the bracket and the electronic component;

the electronic component is electrically coupled to the circuit board through the first conductive layer or the first FPC board;

the bracket defines a wire outlet corresponding to the first FPC board;

the circuit board defines a first window corresponding to the wire outlet;

a circuit layer of the circuit board is exposed by the first window, and the first FPC board extends through the wire outlet to outside the bracket and is electrically coupled to a circuit layer of the circuit board exposed in the first window.

* * * * *